(12) United States Patent
Zhang (10) Patent No.: US 12,131,932 B2
(45) Date of Patent: Oct. 29, 2024

(54) TRANSFER SYSTEM AND TRANSFER METHOD

(71) Applicant: CHANGXIN MEMORY TECHNOLOGIES, INC., Anhui (CN)

(72) Inventor: Wen Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 710 days.

(21) Appl. No.: 17/389,668

(22) Filed: Jul. 30, 2021

(65) Prior Publication Data

US 2022/0037183 A1 Feb. 3, 2022

Related U.S. Application Data

(63) Continuation of application No. PCT/CN2021/092899, filed on May 10, 2021.

(30) Foreign Application Priority Data

Jul. 28, 2020 (CN) .......................... 202010739416.0

(51) Int. Cl.
*B61B 3/00* (2006.01)
*B61C 17/12* (2006.01)
*H01L 21/677* (2006.01)

(52) U.S. Cl.
CPC .......... *H01L 21/67733* (2013.01); *B61B 3/00* (2013.01); *B61C 17/12* (2013.01); *H01L 21/6773* (2013.01); *H01L 21/67736* (2013.01)

(58) Field of Classification Search
CPC ..... B61B 3/00; B61C 17/12; H01L 21/67733; H01L 21/6773; H01L 21/67736
See application file for complete search history.

(56) References Cited

U.S. PATENT DOCUMENTS

| 4,850,472 A | 7/1989 | Liebel |
| 5,252,024 A | 10/1993 | Breda |

(Continued)

FOREIGN PATENT DOCUMENTS

| CN | 101276773 A | 10/2008 |
| CN | 102026858 A | 4/2011 |

(Continued)

OTHER PUBLICATIONS

International Search Report in the international application No. PCT/CN2021/092899, mailed on Jul. 29, 2021, 10 pgs.

(Continued)

*Primary Examiner* — Robert J McCarry, Jr.
(74) *Attorney, Agent, or Firm* — Kilpatrick Townsend & Stockton LLP (57) ABSTRACT

A transfer system and a transfer method are provided. The transfer system includes trolley member and a control device. The trolley member moves on a transport rail. The control device is configured to send a first control signal to the trolley member when the trolley member moves to a first preset site. The trolley member grabs a first-type carrier according to the first control signal. The control device is further configured to send a second control signal to the trolley member when the trolley member moves to a second preset site. The trolley member grabs a second-type carrier according to the second control signal. The first-type carrier is configured to carry a semiconductor material, and the second-type carrier is configured to carry a semiconductor material different from the semiconductor material carried by the first-type carrier.

15 Claims, 8 Drawing Sheets

(56) References Cited

U.S. PATENT DOCUMENTS

| | | |
|---|---|---|
| 6,092,678 A | 7/2000 | Kawano |
| 7,441,999 B2 | 10/2008 | Nakao |
| 7,516,859 B2 | 4/2009 | Taniguchi |
| 7,686,176 B2 | 3/2010 | Murata |
| 8,490,802 B2 | 7/2013 | Honda |
| 9,048,275 B2 | 6/2015 | Murata |
| 9,117,853 B2 | 8/2015 | Tsubaki |
| 9,199,826 B2 | 12/2015 | Shibata |
| 9,263,311 B2 | 2/2016 | Ota |
| 10,043,698 B2 | 8/2018 | Ota et al. |
| 10,446,427 B2 | 10/2019 | Honda et al. |
| 10,658,215 B2 | 5/2020 | Lee et al. |
| 2003/0051974 A1 | 3/2003 | Davis |
| 2004/0247416 A1 | 12/2004 | Komatsu |
| 2005/0139564 A1 | 6/2005 | Nakao |
| 2008/0128376 A1 | 6/2008 | Taniguchi |
| 2008/0217278 A1 | 9/2008 | Murata |
| 2011/0062103 A1 | 3/2011 | Honda |
| 2012/0114453 A1 | 5/2012 | Ota |
| 2012/0128452 A1 | 5/2012 | Murata |
| 2013/0195588 A1 | 8/2013 | Shibata |
| 2016/0071754 A1 | 3/2016 | Ota et al. |
| 2018/0358252 A1 | 12/2018 | Honda et al. |
| 2019/0131147 A1 | 5/2019 | Lee et al. |
| 2020/0279759 A1 | 9/2020 | Lee et al. |

FOREIGN PATENT DOCUMENTS

| | | | |
|---|---|---|---|
| CN | 102470982 A | 5/2012 | |
| CN | 102530553 A | 7/2012 | |
| CN | 103025629 A | 4/2013 | |
| CN | 103144951 A | 6/2013 | |
| CN | 203345653 U | 12/2013 | |
| CN | 105377721 A | 3/2016 | |
| CN | 106663649 A | 5/2017 | |
| CN | 108001979 A | 5/2018 | |
| CN | 108352348 A | 7/2018 | |
| CN | 207986157 U | 10/2018 | |
| CN | 109720799 A * | 5/2019 | ............... G03F 1/22 |
| CN | 111032535 A | 4/2020 | |
| CN | 111170162 A | 5/2020 | |
| DE | 2436300 A1 | 2/1976 | |
| DE | 4341487 A1 | 6/1994 | |
| EP | 1925584 A2 | 5/2008 | |
| EP | 1547943 B1 | 9/2009 | |
| JP | S59116389 U | 8/1984 | |
| JP | S60161825 A | 8/1985 | |
| JP | S61238613 A | 10/1986 | |
| JP | H07157073 A | 6/1995 | |
| JP | 2006069687 A | 3/2006 | |
| KR | 20010054697 A | 7/2001 | |
| TW | 201410567 A | 3/2014 | |

OTHER PUBLICATIONS

First Office Action of the Chinese application No. 202010739416.0, issued on May 24, 2022, 13 pgs.

\* cited by examiner

TRANSFER SYSTEM AND TRANSFER METHOD

CROSS-REFERENCE TO RELATED APPLICATION

This is a continuation application of International Patent Application No. PCT/CN2021/092899, filed on May 10, 2021, which claims priority to Chinese patent application No. 202010739416.0, filed on Jul. 28, 2020 and entitled "Transfer System and Transfer Method". The disclosures of International Patent Application No. PCT/CN2021/092899 and Chinese patent application No. 202010739416.0 are incorporated by reference herein in their entireties.

TECHNICAL FIELD

The present disclosure relates to the field of material handling, and in particular to a transfer system and a transfer method.

BACKGROUND

An existing semiconductor Automatic Material Handling System (AMHS) has dual-purpose trolleys for grabbing carriers with different specifications, e.g. a trolley for handling a wafer carrier and a trolley for handling a mask carrier. The two trolleys are used in different regions. Therefore, before the trolleys are put into service, different control programs need to be set so that the trolleys handle different types of carriers in corresponding regions.

However, the applicant has found that: different types of trolleys cannot be used interchangeably due to independence of each other, and each trolley can only play a role in a specific region, so that the problems of reduction in trolley usability and cost waste are caused.

SUMMARY

According to a first aspect of embodiments of the present disclosure, there is provide a transfer system. The transfer system may include trolley member and a control device. The trolley member may be configured to move on a transport rail. The control device may be configured to send a first control signal to the trolley member when the trolley member moves to a first preset site. A first-type carrier may be grabbed by the trolley member according to the first control signal. The control device may be further configured to send a second control signal to the trolley member when the trolley member moves to a second preset site. A second-type carrier may be grabbed by the trolley member according to the second control signal. The first-type carrier may be configured to carry a semiconductor material, and the second-type carrier may be configured to carry a semiconductor material different from the semiconductor material carried by the first-type carrier.

According to a first aspect of embodiments of the present disclosure, there is provide a transfer method, which may be applied to the control device of the above transfer system and may include: acquiring a control signal required by trolley member at each preset site, in which the control signal includes the type of a carrier required to be grabbed by the trolley member and the position of a next preset site to which the trolley member is required to move; and sending the corresponding control signal to the trolley member when the trolley member is at the preset site.

DETAILED DESCRIPTION

At present, different types of trolleys cannot be used interchangeably due to independence of each other, and each trolley can only play a role in a specific region, so that the problems of trolley usability reduction and cost waste are caused.

To solve the above-described problems, an embodiment of the present disclosure provides a transfer system. The transfer system includes trolley member and a control device. The trolley member is configured to move on a transport rail. The control device is configured to send a first control signal to the trolley member when the trolley member moves to a first preset site. The trolley member grabs a first-type carrier according to the first control signal. The control device is further configured to send a second control signal to the trolley member when the trolley member moves to a second preset site. The trolley member grabs a second-type carrier according to the second control signal. The first-type carrier is configured to carry a semiconductor material, and the second-type carrier is configured to carry a semiconductor material different from the semiconductor material carried by the first-type carrier.

To more clarify the objects, technical solutions, and advantages of the embodiments of the present disclosure, various embodiments of the present disclosure will be described below in combination with the accompanying drawings. However, those of ordinary skill in the art will appreciate that in various embodiments of the present disclosure, numerous technical details are set forth in order to provide readers with a better understanding of the present disclosure. However, even without these technical details and various changes and modifications based on the following embodiments, the claimed technical solution of the present disclosure may be implemented. The following divisions of the various embodiments are for convenience of description and should not be construed as limiting specific implementations of the present disclosure, and the various embodiments may be combined and cited with each other without contradiction.

Figure 1:
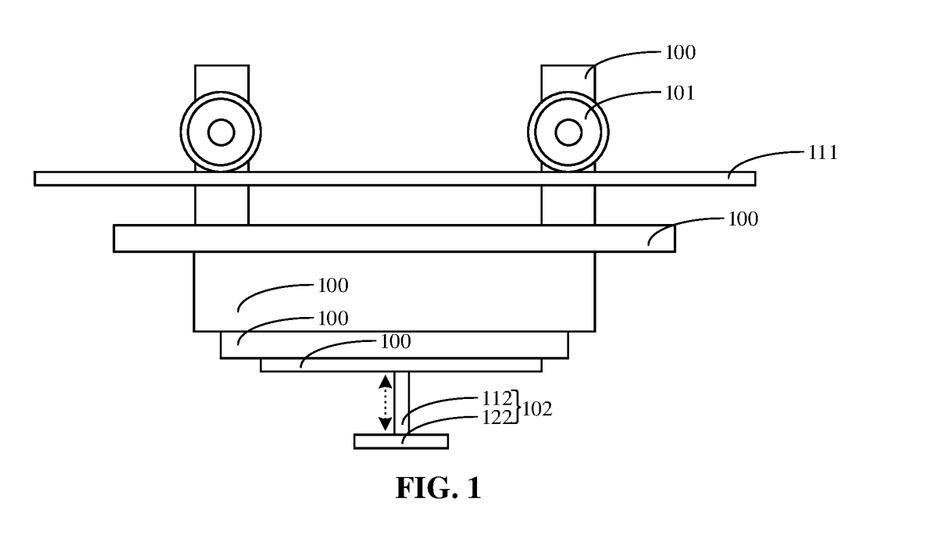
FIG. 1 is a schematic view of a transfer system according to an embodiment of the present disclosure.

FIG. 1 is a schematic diagram showing a cross-sectional structure of a transfer system according to an embodiment of the present disclosure. The transfer system of the present embodiment will be described in detail with reference to the accompanying drawings.

Referring to FIG. 1, the transfer system includes: trolley member, a transport rail 111, and a control device (not shown).

It should be noted that in the present embodiment, two types of carriers, i.e. a first-type carrier and a second-type carrier, are taken as an example to embody that the trolley member in the present embodiment may grab different types of carriers according to different control signals, however, the example does not limit the of the present disclosure. In other embodiments, the trolley member may grab three or more types of carriers according to different control signals.

The trolley member moves on the transport rail 111, and the control device controls the trolley member to move on the transport rail 111 by sending a control signal.

That is, the control device needs to acquire a control signal required by the trolley member at each preset site. Specifically, the control signal in the control device is acquired in the following manner.

An action performed by the trolley member at each preset site is simulated. For example, the type of a carrier required to be grabbed by the trolley member and the position of a next preset site to which the trolley member is required to move are included. The action performed by the trolley member at each preset site is recorded to obtain a transfer record of the trolley member. The control signal required by the trolley member at each preset site is generated based on the transfer record. The control signal includes: the type of a carrier required to be grabbed by the trolley member, and the position of a next preset site to which the trolley member is required to move. For example, a first control signal required by the trolley member at a first preset site and a second control signal required by the trolley member at a second preset site are included.

When the trolley member is at a preset site, the control device sends the corresponding control signal to the trolley member.

Specifically, in the present embodiment, the first control signal is a control signal for controlling the trolley member to grab the first-type carrier, and the second control signal is a control signal for controlling the trolley member to grab the second-type carrier. Since the first-type carrier and the second-type carrier are configured to carry materials of different qualities or sizes, the size of the first-type carrier is also different from the second-type carrier. Specifically, the first-type carrier is a carrier for carrying wafers, and the second-type carrier is a carrier for carrying masks.

The control device sends a first control signal to the trolley member when the trolley member moves to a first preset site, and the trolley member grabs the first-type carrier based on the first control signal. The control device sends a second control signal to the trolley member when the trolley member moves to a second preset site, and the trolley member grabs the second-type carrier based on the second control signal.

In the present embodiment, the trolley member includes a trolley body 100. The trolley body 100 is provided with a communication interface for receiving the first control signal or the second control signal sent by the control device. The trolley body 100 moves on the transport rail 111 based on the first control signal or the second control signal.

In one example, information is exchanged between the trolley member and the control device via a wired communication manner. In the wired communication manner, the trolley member and the control device transmit and receive control signals through a connection line. One end of the connection line is connected to the control device, and the other end of the connection line is installed on the communication interface of the trolley body 100.

In one example, information is exchanged between the trolley member and the control device via a wired or wireless communication manner. In the wireless communication manner, the trolley member and the control device transmit and receive control signals through a WiFi network or Bluetooth communication, etc.

Specifically, information is exchanged between the trolley member and the control device through an E84 communication manner. The E84 communication manner is communication between a control device of a semiconductor manufacturing device and a handling trolley such as overhead traveling trolley member, and is an E84 communication sequence suitable for the Semiconductor Equipment and Materials International (SEMI). A carrier containing a wafer or a mask, etc. is taken as a handled object, and is handled by the overhead traveling trolley member. A control signal is transmitted and received between the overhead traveling trolley member and the control device through the E84 communication sequence.

The trolley body 100 is provided with a moving wheel 101, and the trolley body 100 moves on the transport rail 111 through the moving wheel 101.

The trolley member further includes a grabbing assembly 102, connected to the trolley body 100 and configured to grab the first-type carrier according to the first control signal or grab the second-type carrier according to the second control signal.

Specifically, the grabbing assembly 102 includes a telescopic portion 112 and a grabbing portion 122. The telescopic portion 112 is extendable or retractable to grab different types of carriers. The grabbing portion 122 is configured to grab different types of carriers.

One end of the telescopic portion 112 is fixedly connected to the trolley body 100, the other end is fixedly connected to the grabbing portion 122, and the telescopic portion 112 has a telescopic body. That is, the telescopic portion 112 may be extended and retracted. When the trolley member receives a control signal, the telescopic portion 112 is extended until the grabbing portion 122 can grab a carrier to be grabbed. When the trolley member has grabbed the carrier to be grabbed, the telescopic portion 112 is retracted to an original position.

In the present embodiment, the grabbing portion 122 is configured to grab the first-type carrier or the second-type carrier.

It can be seen from the foregoing that the first-type carrier and the second-type carrier are configured to carry materials of different qualities or sizes, and the size of the first-type carrier is different from the size the second-type carrier. That is, for carriers of different types to be grabbed by the grabbing assembly 102, the extending lengths of the telescoping portions 112 are different. In one example, the telescoping portion 112 is extended to a first length according to the first control signal to grab the first-type carrier; or the telescopic portion 112 is extended to a second length according to the second control signal to grab the second-type carrier.

Based on the above-described discussion, it can be seen that in the present embodiment, the control signal also includes a length of the telescoping portion 112 required to be extended, i.e., the control signal also includes a length of the grabbing assembly 102 required to be extended.

The first-type carrier and the second-type carrier are configured to carry materials of different qualities or sizes, and the size of the first-type carrier is different from the size of the second-type carrier. In order for the grabbing portion 122 to better grab different types of carriers, the grabbing portion 122 needs to perform the grab at a corresponding grabbing angle.

Specifically, the present embodiment shows two manner of rotating the grabbing portion 122, specifically as follows.

In the first rotating manner, the grabbing assembly 102 further includes a first rotating portion (not shown). The telescopic portion 112 is connected to the trolley body 100 through the first rotating portion for controlling the telescopic portion 112 to rotate. Since the telescoping portion 112 is fixedly connected to the grabbing portion 122, the grabbing portion 122 is rotated during the rotation of the telescoping portion 112.

The first rotating portion is configured to rotate the telescopic portion 112 to a preset angle based on the control signal. In one example, the first rotating portion is configured to rotate the telescopic portion 112 to a first preset angle based on a first control signal, so that the grabbing portion 122 can grab the first-type carrier; or the first rotating portion is configured to rotate the telescopic portion 112 to a second preset angle based on a second control signal, so that the grabbing portion 122 can grab the second-type carrier.

It should be noted that the first rotating portion may be disposed on the telescopic portion 112 to control the telescopic portion 112 to rotate. The first rotating portion may also be disposed on another equipment to realize the rotation of the first rotating portion. The component on which the first rotating portion is disposed is not specifically limited in the present embodiment.

In the second rotating mode, the grabbing assembly 102 further includes a second rotating portion (not shown). The grabbing portion 122 is connected to the telescopic portion 112 through the second rotating portion for controlling the grabbing portion 122 to rotate.

The second rotating portion is configured to rotate the grabbing portion 122 to a preset angle based on the control signal. In one example, the second rotating portion is configured to rotate the grabbing portion 122 to a first preset angle based on a first control signal, so that the grabbing portion 122 can grab the first-type carrier; or the second rotating portion is configured to rotate the grabbing portion 122 to a second preset angle based on a second control signal, so that the grabbing portion 122 can grab the second-type carrier.

It should be noted that the second rotating portion may be disposed on the grabbing portion 122 to control the grabbing portion 122 to rotate. The second rotating portion may also be disposed on another equipment to realize the rotation of the second rotating portion. The component on which the second rotating portion is disposed is not specifically limited in the present embodiment.

Based on the above-described context, it can be seen that in the present embodiment, the control signal also includes an angle of the telescoping portion 112 or the grabbing portion 122 required to be rotated, i.e., the control signal also includes an angle of the grabbing assembly 102 required to be rotated.

Compared with the related art, trolley member and a control device are designed in the present embodiment in such a way that when the trolley member reaches a preset site, the control system sends corresponding control signals to the trolley member, and the trolley member grabs corresponding types of carriers based on the control signals. Therefore, different types of carriers can be grabbed by the same trolley member, the usability of the trolley member is improved, and the cost is saved.

It is worth noting that each component referred to in the present embodiment is a functional component. In practical disclosure, a functional component may be a physical unit or a part of a physical unit, or may be implemented with a combination of physical units. In addition, in order to highlight the innovative portion of the present disclosure, units not closely related to solving the technical problems set forth in the present disclosure have not been introduced in the present embodiment, but this does not indicate that other units are not present in the present embodiment.

Another embodiment of the present disclosure relates to a transfer system. Different from the above embodiment, the present embodiment also serves to prevent collision of a carrier grabbed by trolley member during the movement of the trolley member.

Figure 2:
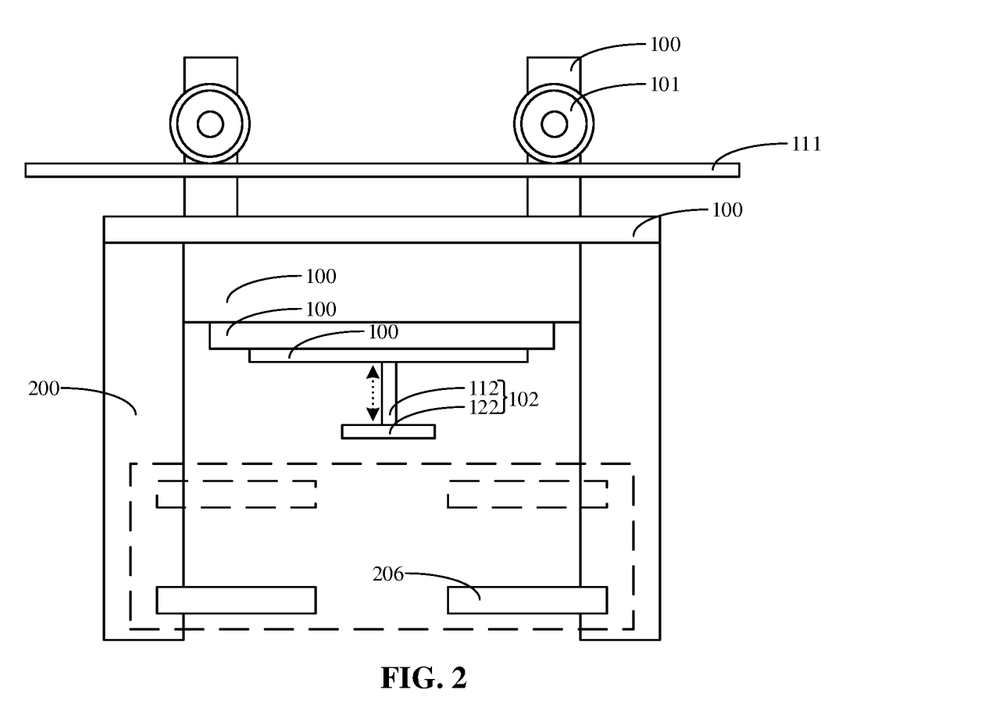
FIGS. 2 to 4 are schematic views of a transfer system according to another embodiment of the present disclosure.
Figure 3:
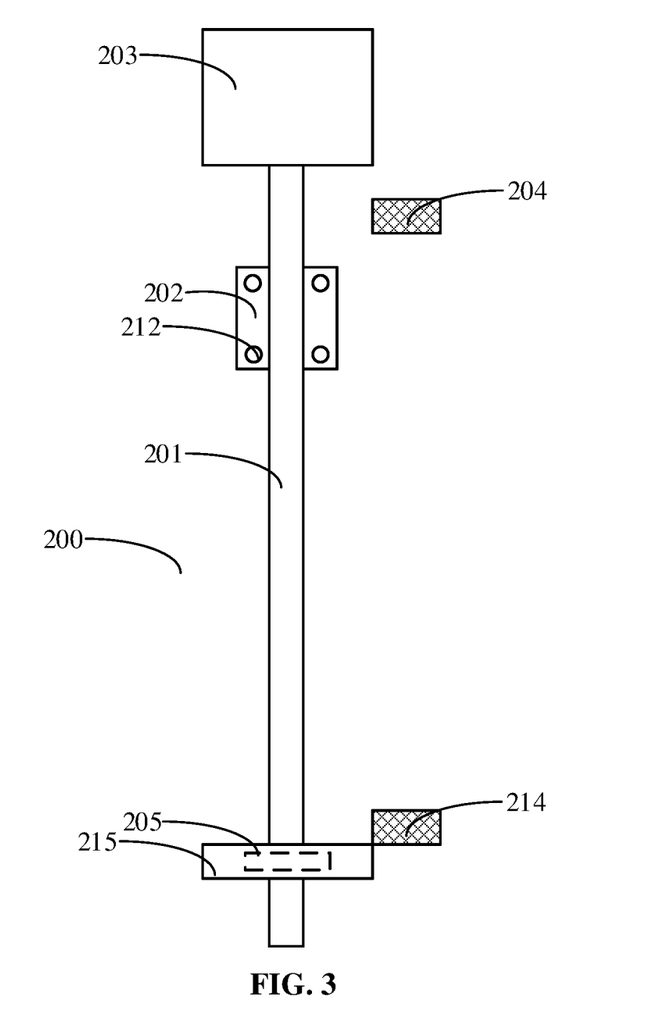
Figure 4:
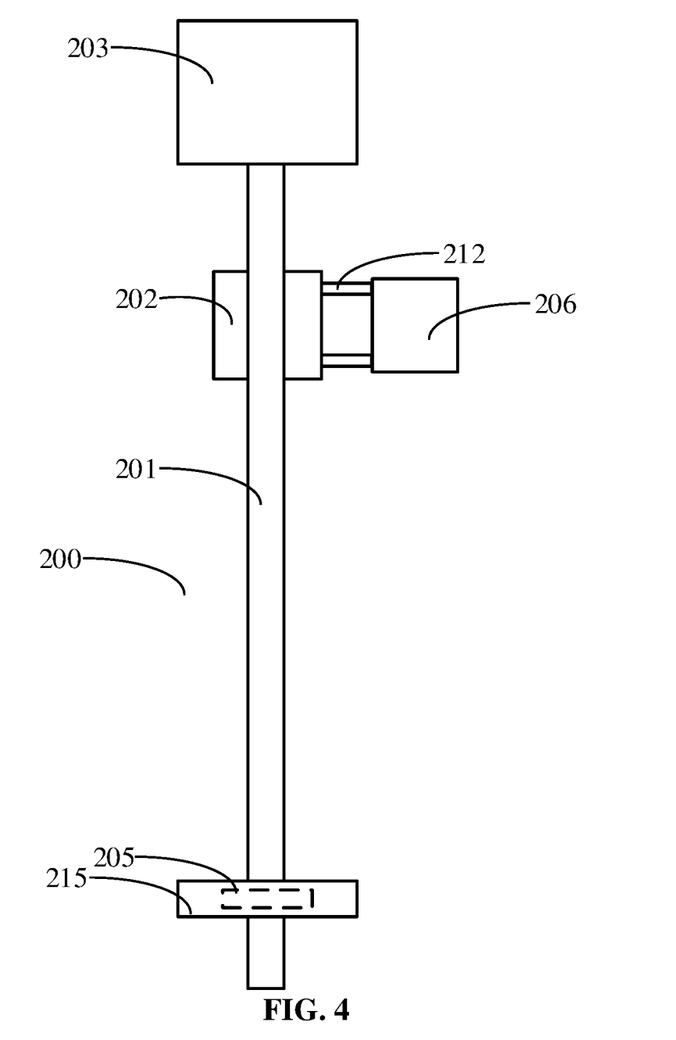

FIGS. 2-4 are schematic diagrams showing a cross-sectional structure of a transfer system according to an embodiment of the present disclosure. The transfer system of the present embodiment will be described in detail with reference to the accompanying drawings.

Referring to FIG. 2, the transfer system further includes: a first protection assembly 200, disposed on the trolley body 100 and configured to prevent collision of a carrier grabbed by the trolley member during the movement of the trolley member. A second protection assembly 206 is movably disposed on the first protection assembly 200 and configured to support a bottom surface of the first-type carrier or the second-type carrier grabbed by the grabbing assembly 102. A first drive assembly (not shown) is disposed on the first protection assembly 200 and configured to control the second protection assembly 206 to move on the first protection assembly 200.

Referring to FIGS. 3 and 4, FIG. 3 is a schematic diagram showing a cross-sectional structure of the first protection assembly 200 as viewed from the second protection assembly 206. FIG. 4 is a schematic diagram showing a cross-sectional structure in the direction of FIG. 2.

In the present embodiment, the first protection assembly 200 includes a first support rod 201 and a first sliding block 202.

The first support rod 201 is disposed on the trolley body. The first sliding block 202 is disposed around the first support rod 201 and is movable on the first support rod, and the second protection assembly 206 is fixedly disposed on the first sliding block 202.

Specifically, the first sliding block 202 is provided with a connecting portion 212. The connecting portion 212 is fixedly connected to the second drive assembly 206, and the first drive assembly 200 and the second drive assembly 206 are perpendicular to each other.

The first drive assembly 203 is disposed on the first support rod 201 and configured to control the first sliding block 202 to move on the first support rod 201.

In the present embodiment, the first protection assembly 200 further includes: a first sensing device 204 and a second sensing device 214, which are configured to detect whether the first sliding block 202 is located at an edge position of the first support rod 201. Specifically, the first sensing device 204 is configured to detect whether the first sliding block 202 is located at a top edge position of the first support rod 201. The second sensing device 214 is configured to detect whether the first sliding block 202 is located at a bottom edge position of the first support rod 201.

It should be noted that the first sensing device 204 and the second sensing device 214 may be disposed on the first support rod 201 or may be disposed in the first protection assembly 200 where the first support rod 201 is located. The positions of the first sensing device 204 and the second sensing device 214 are not limited in the present embodiment.

In the present embodiment, the first protection assembly 200 further includes a support rod fixing portion 215, disposed on the first protection assembly 200 and configured to limit movement of the second protection assembly 206 on the first protection assembly 200. The support rod fixing portion 215 is fixed at an end of the first support rod 201 away from the trolley body, and thus the second protection assembly 206 is prevented from being separated from the first support rod 201.

Specifically, in the present embodiment, the first support rod 201 includes a first lead screw, i.e. the first support rod 201 is in the form of a lead screw. The first drive assembly 203 is disposed on the first lead screw and configured to control the first lead screw to rotate. The first sliding block 202 is movably disposed on the first lead screw, and the first sliding block 202 is movable in a direction, along which the first lead screw is disposed, during the rotation of the first lead screw. At this moment, since the first lead screw needs to be rotated, the support rod fixing portion 215 at the bottom of the first lead screw is disposed on the first support rod 201 by means of a bearing, i.e. the support rod fixing portion 215 is disposed on the first support rod 201 by means of a rotating bearing 205.

In the present embodiment, the first sliding block 202 may move on the first support rod 201 by providing threads on the first support rod 201. In other embodiments, the first sliding block may move on the first support rod by means of a bayonet, etc.

Compared with the related art, trolley member and a control device in the present embodiment are designed in such a way that when the trolley member reaches a preset site, the control system sends corresponding control signals to the trolley member, and the trolley member grabs corresponding types of carriers based on the control signals. Therefore, different types of carriers can be grabbed by the same trolley member, the usability of the trolley member is improved, and the cost is saved.

It is worth noting that each component referred to in the present embodiment is a functional component. In practical disclosure, a functional component may be a physical unit or a part of a physical unit, or may be implemented with a combination of physical units. In addition, in order to highlight the innovative portion of the present disclosure, units not closely related to solving the technical problems set forth in the present disclosure have not been introduced in the present embodiment, but this does not indicate that other units are not present in the present embodiment.

Yet another embodiment of the present disclosure relates to a transfer system. Different from the above-described embodiment, the present embodiment also serves to support the bottom of a carrier grabbed by trolley member, thereby ensuring the stability of the carrier grabbed by the trolley member during the movement of the trolley member.

Figure 5:
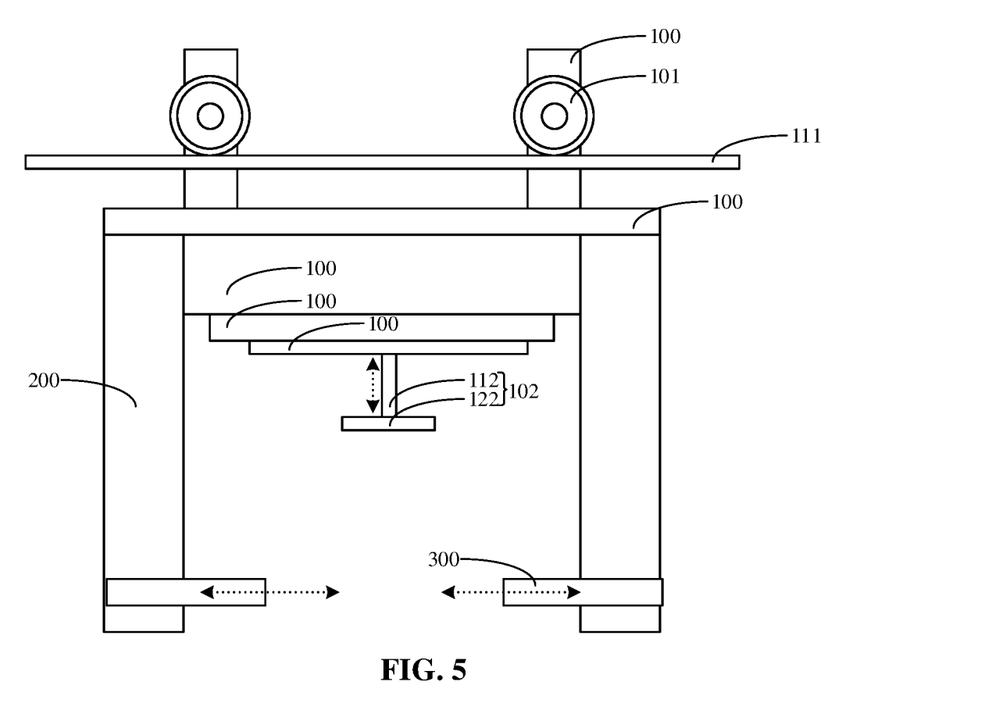
FIGS. 5 to 7 are schematic structure views of a transfer system according to yet another embodiment of the present disclosure.
Figure 6:
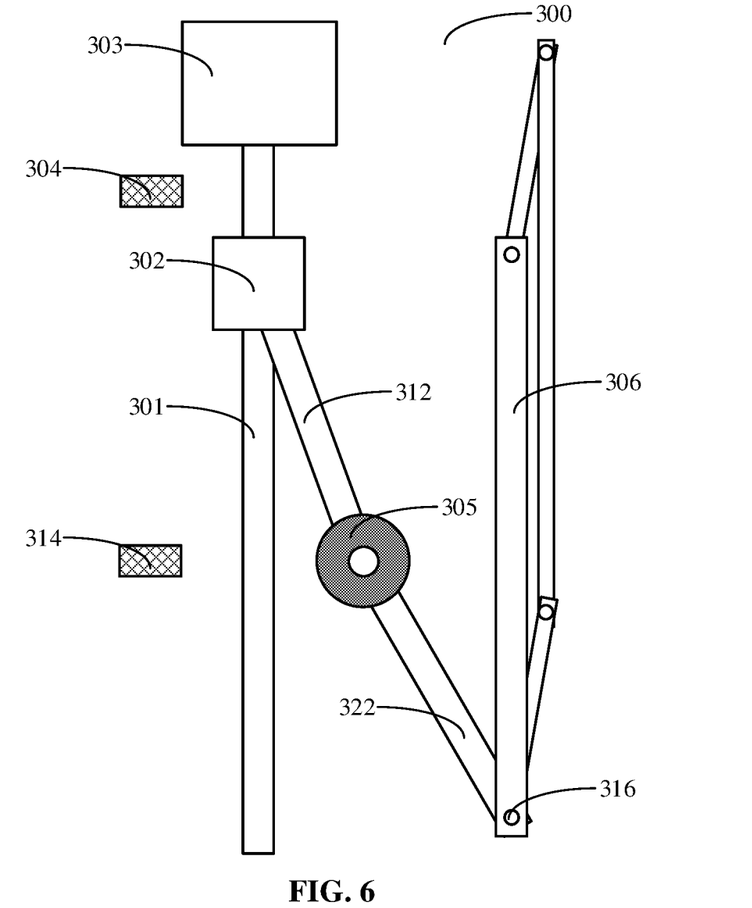
Figure 7:
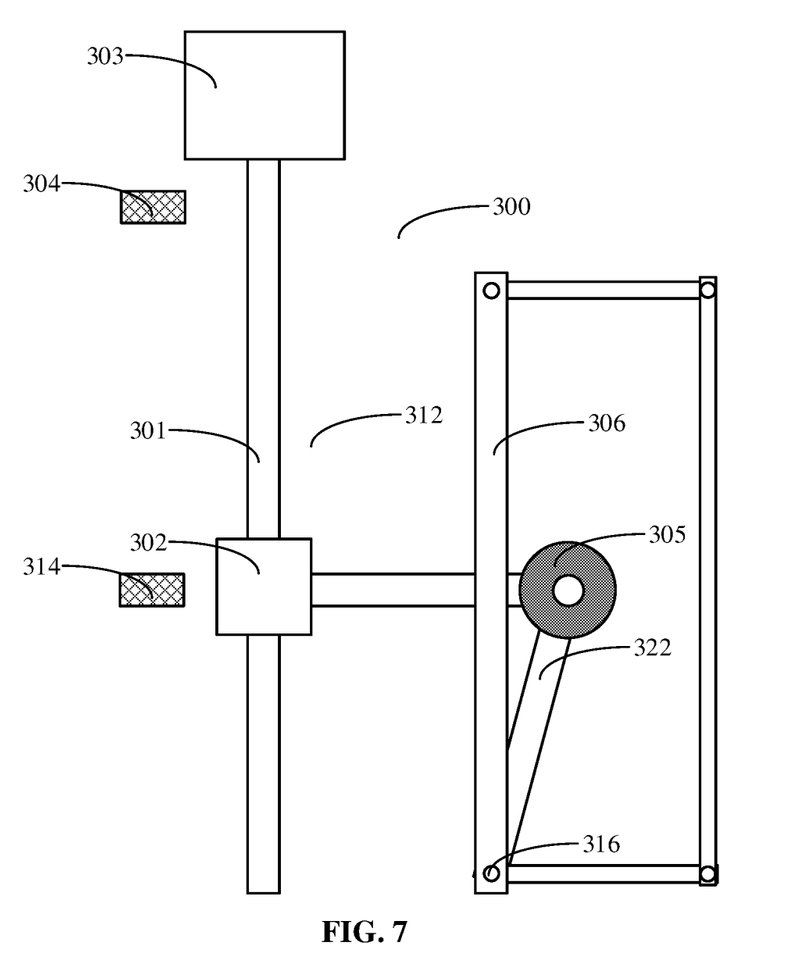

FIGS. 5-7 are schematic diagrams showing a cross-sectional structure of a transfer system according to an embodiment of the present disclosure. The transfer system of the present embodiment will be described in detail with reference to the accompanying drawings.

Referring to FIGS. 5-7, FIG. 6 is a schematic diagram showing a cross-sectional structure of a support rod in a folded state. FIG. 7 is a schematic diagram showing a cross-sectional structure of a support rod in an unfolded state. The second protection assembly 300 includes a second support rod 301, a second sliding block 302, and a support frame.

The second support rod 301 is movably disposed on the first protection assembly 200, and a direction along which the second support rod 301 is disposed is perpendicular to a direction along which the first protection assembly 200 is disposed.

The second sliding block 302 is disposed around the second support rod 301 and is movable on the second support rod.

The support frame includes a support plate 306 and an adhesion assembly 316, the support frame is connected to the second sliding block 302, and configured to support a bottom surface of the first-type carrier or the second-type carrier grabbed by the grabbing assembly 102.

In the present embodiment, the second protection assembly 300 further includes a second drive assembly 303, disposed on the second support rod 301 and configured to control the second sliding block 302 to move on the second support rod 301.

In one example, the second support rod 301 includes a second lead screw, i.e. the second support rod 301 is in the form of a lead screw. The second drive assembly 303 is disposed on the second lead screw and configured to control the second lead screw to rotate. The second sliding block 302 is movably disposed on the second lead screw, and the second sliding block 302 is movable in a direction, along which the second lead screw is disposed, during the rotation of the second lead screw.

In the present embodiment, the second sliding block 302 may move on the second support rod 301 by providing threads on the second support rod 301. In other embodiments, the second sliding block may move on the second support rod by means of a bayonet, etc.

Specifically, when the second sliding block 302 is at a first preset position, the support frame is in a folded state. When the second sliding block 302 is at a second preset position, the support frame is in an unfolded state. In the folded state, the size of a gap in the support frame is greater than the size of the first-type carrier or the size of the second-type carrier. In the unfolded state, the size of the gap in the support frame is smaller than the size of the first-type carrier or the size of the second-type carrier. The size of the gap in the support frame refers to a size of a gap between the second protection assemblies 300 on two sides of the grabbing assembly 102. When the second sliding block 302 moves from the first preset position to the second preset position, the support frame is switched from the folded state to the unfolded state. When the second sliding block 302 moves from the second preset position to the first preset position, the support frame is switched from the unfolded state to the folded state.

In the present embodiment, the second protection assembly 300 further includes a third sensing device 304 and a fourth sensing device 314, which are configured to detect whether the second sliding block 302 is located at the first preset position or the second preset position. Specifically, the third sensing device 304 is configured to detect whether the second sliding block 302 is located at the first preset position of the second support rod 301. The fourth sensing device 314 is configured to detect whether the second sliding block 302 is located at the second preset position of the second support rod 301.

It should be noted that the third sensing device 304 and the fourth sensing device 314 may be disposed on the second support rod 301 or may be disposed in the second protection assembly 300 where the second support rod 301 is located. The positions of the third sensing device 304 and the fourth sensing device 314 are not limited in the present embodiment.

In the present embodiment, the support frame is fixedly connected to the second sliding block 302 by a roller. Referring to FIGS. 6 and 7, the second sliding block 302 is connected to the roller 305 through a first connecting rod 312. The roller 305 is connected to the support frame through a second connecting rod 322. When the second sliding block 302 moves on the second support rod 301, the second sliding block pushes the roller 305 to move the position of the roller 305, so that support frame is switchable between the unfolded state and the folded state.

In other embodiments, one end of the support frame may be fixedly disposed on the second sliding block, and the support frame may be switchable between the unfolded state and the folded state by telescoping manner or rotating manner.

Specifically, if a rotating manner is adopted, one end of the support frame is fixedly disposed on the second sliding block. When the support frame is in a folded state, an angle between the rotating support frame and the first protection assembly 200 is 0° or 180°. When the support frame is in an unfolded state, the angle between the rotating support frame and the first protection assembly 200 is 90°.

If a telescopic manner is adopted, one end of the support frame is fixedly disposed on the second sliding block. When the support frame is in a folded state, the support frame is controlled to be retracted to the shortest length. When the support frame is in an unfolded state, the support frame is controlled to be extended to the longest length.

It should be noted that the example of switching the support frame between the unfolded state and the folded state in the present embodiment is only for the purpose of enabling those skilled in the art to clearly understand the switching mode of the present solution, and does not limit the present embodiment. The mode of switching the support frame between the unfolded state and the folded state may be set according to corresponding requirements in a specific use process.

Compared with the related art, trolley member and a control device are designed in the present embodiment in such a way that, when the trolley member reaches a preset site, the control system sends corresponding control signals to the trolley member, and the trolley member grabs corresponding types of carriers based on the control signals. Therefore, different types of carriers can be grabbed by the same trolley member, the usability of the trolley member is improved, and the cost is saved.

It is worth noting that each component referred to in the present embodiment is a functional component. In practical disclosure, a functional component may be a physical unit or a part of a physical unit, or may be implemented with a combination of physical units. In addition, in order to highlight the innovative portion of the present disclosure, units not closely related to solving the technical problems set forth in the present disclosure have not been introduced in the present embodiment, but this does not indicate that other units are not present in the present embodiment.

A further embodiment of the present disclosure relates to a transfer method.

Figure 8:
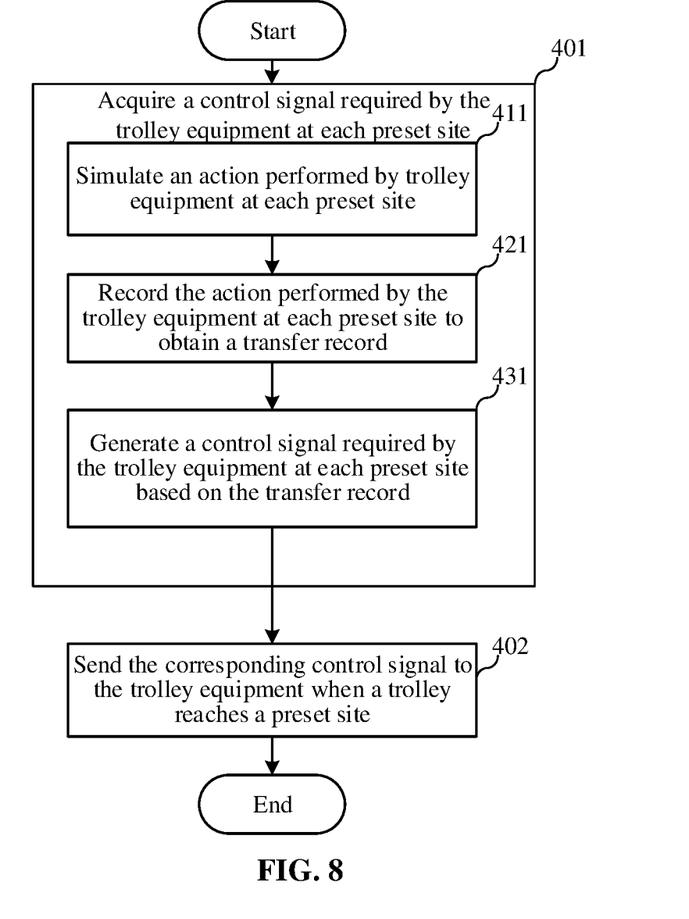
FIG. 8 is a schematic flowchart of a transfer method according to a further embodiment of the present disclosure.

Referring to FIG. 8, the transfer method provided by the present embodiment will be described in detail with reference to the accompanying drawings, and descriptions of the same or corresponding parts as those in the above embodiment will be omitted hereinafter.

The transfer method includes the following steps. A control signal required by trolley member at each preset site is acquired. The control signal includes: the type of a carrier required to be grabbed by the trolley member, and the position of a next preset site to which the trolley member is required to move. When the trolley member is at the preset site, the corresponding control signal is sent to the trolley member.

It should be noted that in the present embodiment, two types of carriers, i.e. a first-type carrier and a second-type carrier, are taken as a example to embody that the trolley member in the present embodiment may grab different types of carriers according to different control signals and does not limit the embodiments of the present disclosure. In other embodiments, the trolley member may grab three or more types of carriers according to different control signals.

Referring to FIG. 8, the transfer method includes the following steps.

In step 401, a control signal required by trolley member at a preset site is acquired.

A control device needs to acquire a control signal required by the trolley member at each preset site, and then can accurately control trolley member when the trolley member reaches each preset site. The following steps are specifically included.

In sub-step 411, an action performed by the trolley member at each preset site is simulated.

The action performed by the trolley member at each preset site is simulated. For example, the type of a carrier required to be grabbed by the trolley member and the position of a next preset site to which the trolley member is required to move are included.

In sub-step 421, the action performed by the trolley member at each preset site is recorded, and a transfer record is obtained.

The action performed by the trolley member is simulated in sub-step 411, the action is converted into a corresponding text language, to obtain store a corresponding transfer record.

In sub-step 431, a control signal required by the trolley member at each preset site is generated based on the transfer record.

The control signal required by the trolley member at each preset site is generated based on the transfer record. The control signal includes: the type of a carrier required to be grabbed by the trolley member, and the position of a next preset site to which the trolley member is required to move. For example, a first control signal required by the trolley member at a first preset site and a second control signal required by the trolley member at a second preset site are included.

It should be noted that in other embodiments, multiple tests may be required to ensure the accuracy of transfer of the trolley member after obtaining the control signal required by the trolley member at each preset site.

In step 402, when a trolley reaches a preset site, the corresponding control signal is sent to the trolley member.

Specifically, in the present embodiment, the first control signal is a control signal for controlling the trolley member to grab the first-type carrier, and the second control signal is a control signal for controlling the trolley member to grab the second-type carrier. Since the first-type carrier and the second-type carrier are configured to carry materials of different qualities or sizes, the size of the first-type carrier is different from the second-type carrier. Specifically, the first-type carrier is a carrier for carrying wafers, and the second-type carrier is a carrier for carrying masks.

The control device sends a first control signal to the trolley member when the trolley member moves to a first preset site, and the trolley member grabs the first-type carrier based on the first control signal. The control device sends a second control signal to the trolley member when the trolley member moves to a second preset site, and the trolley member grabs the second-type carrier based on the second control signal.

It should also be noted that in other embodiments, the control signal further includes an angle of the grabbing assembly in the trolley member required to be rotated or an extending length of the grabbing assembly in the trolley member required to be extended.

Compared with the related art, a control device firstly acquires a control signal required by trolley member at each site in the present embodiment. During practical disclosure, when the trolley member reaches a corresponding preset site, the corresponding control signal is sent to the trolley member so as to control the trolley member to grab corresponding types of carriers and move. Different types of carriers can be grabbed by the same trolley member, the usability of the trolley member is improved, and the cost is saved.

The above division of various steps is merely for clarity of description. During implementation, the steps may be combined into one step or some steps may be split and decomposed into a plurality of steps, which may be within the scope of protection of this patent as long as the same logical relationship is included. It is within the scope of protection of this patent to add insignificant modifications to the process or to introduce insignificant designs without changing the core design of the process.

Since the above-described embodiments correspond to the present embodiment, the present embodiment may be implemented in cooperation with the above-described embodiments. The related technical details mentioned in the above-described embodiments are still valid in the present embodiment, and the technical effects that can be achieved in the above-described embodiments may also be achieved in the present embodiment. Descriptions are omitted here in order to reduce repetition. Accordingly, the related technical details mentioned in the present embodiment may also be applied to the above-described embodiments.

It will be appreciated by those of ordinary skill in the art that the various embodiments described above are specific embodiments for implementing the present disclosure and that various changes in form and details may be made in practice without departing from the spirit and scope of the present disclosure.

The invention claimed is:

1. A transfer system, comprising: trolley member, a transport rail, and a control device, wherein
the trolley member is configured to move on the transport rail, wherein the trolley member comprises a trolley body and a grabbing assembly;
the grabbing assembly comprises: a telescopic portion, having one end fixedly connected to the trolley body and the other end fixedly connected to a grabbing portion, a body of the telescopic portion being extendable;
the control device is configured to send a first control signal to the trolley member when the trolley member moves to a first preset site;
the control device is further configured to send a second control signal to the trolley member when the trolley member moves to a second preset site; and, wherein
the telescopic portion is configured to be extended to a first length according to the first control signal and extended to a second length according to the second control signal;
the grabbing portion is configured to grab the first-type carrier according to the first control signal or grab the second-type carrier according to the second control signal;
and
the first-type carrier is configured to carry a semiconductor material, and the second-type carrier is configured to carry a semiconductor material different from the semiconductor material carried by the first-type carrier.

2. The transfer system of claim 1, wherein the trolley body provided with a communication interface for receiving the first control signal or the second control signal, the trolley body moving on the transport rail based on the first control signal or the second control signal.

3. The transfer system of claim 1, wherein the grabbing assembly further comprises:
a first rotating portion, through which the telescopic portion is connected to the trolley body, the first rotating portion being configured to control the telescopic portion to rotate, wherein
the first rotating portion is configured to rotate the telescopic portion to a first preset angle based on the first control signal or rotate the telescopic portion to a second preset angle based on the second control signal.

4. The transfer system of claim 1, wherein the grabbing assembly further comprises:
a second rotating portion, through which the grabbing portion is connected to the telescopic portion, the second rotating portion being configured to control the grabbing portion to rotate, wherein
the second rotating portion is configured to rotate the grabbing portion to a first preset angle based on the first control signal or rotate the grabbing portion to a second preset angle based on the second control signal.

5. The transfer system of claim 1, wherein the trolley body further comprises:
a first protection assembly, disposed on the trolley body;
a second protection assembly, movably disposed on the first protection assembly and configured to support a bottom surface of the first-type carrier or the second-type carrier grabbed by the grabbing assembly; and
a first drive assembly, disposed on the first protection assembly and configured to control the second protection assembly to move on the first protection assembly.

6. The transfer system of claim 5, wherein the first protection assembly comprises:
a first support rod, disposed on the trolley body; and
a first sliding block, disposed around the first support rod and movable on the first support rod, the second protection assembly being fixedly disposed on the first sliding block, wherein
the first drive assembly is disposed on the first support rod and configured to control the first sliding block to move on the first support rod.

7. The transfer system of claim 6, wherein the first protection assembly further comprises:
a support rod fixing portion, fixedly connected to an end, away from the trolley body, of the first support rod.

8. The transfer system of claim 6, wherein the first support rod comprises a first lead screw, the first drive assembly being disposed on the first lead screw and configured to control the first lead screw to rotate, the first sliding block being movably disposed on the first lead screw, and the first sliding block being movable in a direction, along which the first lead screw is disposed, during rotation of the first lead screw.

9. The transfer system of claim 5, wherein the second protection assembly comprises:
a second support rod, movably disposed on the first protection assembly, a direction along which the second support rod is disposed being perpendicular to a direction along which the first protection assembly is disposed;

a second sliding block, disposed around the second support rod and movable on the second support rod; and a support frame, connected to the second sliding block and configured to support the bottom surface of the first-type carrier or the second-type carrier grabbed by the grabbing assembly.

10. The transfer system of claim 9, wherein the second protection assembly further comprises:

a second drive assembly, disposed on the second support rod and configured to control the second sliding block to move on the second support rod, wherein when the second sliding block is at a first preset position, the support frame is in a folded state;

when the second sliding block is at a second preset position, the support frame is in an unfolded state;

in the folded state, a size of a gap in the support frame is greater than a size of the first-type carrier or a size of the second-type carrier; in the unfolded state, the size of the gap in the support frame is smaller than the size of the first-type carrier or the size of the second-type carrier; and when the second sliding block moves from the first preset position to the second preset position, the support frame is switched from the folded state to the unfolded state, and when the second sliding block moves from the second preset position to the first preset position, the support frame is switched from the unfolded state to the folded state.

11. The transfer system of claim 10, wherein the second support rod comprises a second lead screw, the second drive assembly being disposed on the second lead screw and configured to control the second lead screw to rotate, the second sliding block being movably disposed on the second lead screw, and the second sliding block being movable in a direction, along which the second lead screw is disposed, during rotation of the second lead screw.

12. The transfer system of claim 10, wherein one end of the support frame is fixedly disposed on the second sliding block, the support frame being switchable between the unfolded state and the folded state by telescoping or rotating.

13. The transfer system of claim 10, wherein the support frame is fixedly connected to the second sliding block by a roller, a position of the roller is moved under a push of the second sliding block when the second sliding block moves on the second support rod, to switch the support frame between the unfolded state and the folded state.

14. A transfer method applied to a control device of a transfer system, comprising:

acquiring a control signal required by a trolley member of the transfer system at each preset site, wherein the control signal comprising: a type of a carrier required to be grabbed by the trolley member, and a position of a next preset site to which the trolley member is required to move;

sending a corresponding control signal to the trolley member when the trolley member is at the preset site; and, wherein the control signal further comprises a rotating angle and an extending length required for the trolley member.

15. The transfer method of claim 14, wherein the acquiring a control signal required by trolley member at each preset site comprises:

simulating an action performed by the trolley member at each preset site;

recording the action performed by the trolley member at each preset site to obtain a transfer record; and generating the control signal required by the trolley member at each preset site based on the transfer record.

* * * * *